(12) United States Patent
Harada et al.

(10) Patent No.: US 8,524,576 B2
(45) Date of Patent: Sep. 3, 2013

(54) WAFER PROCESSING METHOD

(75) Inventors: Seiji Harada, Ota-Ku (JP); Yoshikazu Kobayashi, Ota-Ku (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 13/451,283

(22) Filed: Apr. 19, 2012

(65) Prior Publication Data
US 2012/0289060 A1    Nov. 15, 2012

(30) Foreign Application Priority Data

May 12, 2011 (JP) .................................. 2011-107001

(51) Int. Cl.
*H01L 21/46*    (2006.01)
(52) U.S. Cl.
USPC ................................... 438/460; 257/E21.237
(58) Field of Classification Search
USPC .......... 438/459, 465, 460, 959; 257/E21.237
See application file for complete search history.

(56) References Cited

U.S. PATENT DOCUMENTS 6,680,241 B2 * 1/2004 Okamoto et al. ............. 438/464
7,638,858 B2   12/2009 Kurosawa et al.

FOREIGN PATENT DOCUMENTS

| JP | 2002-192370 | 7/2002 |
| JP | 2005-086161 | 3/2005 |
| JP | 2006-080329 | 3/2006 |
| JP | 2009-026992 | 2/2009 |

OTHER PUBLICATIONS

Notice of Allowance issued in related corresponding U.S. Appl. No. 13/450,968, mailed Apr. 8, 2013.

* cited by examiner

*Primary Examiner* — Quoc Hoang
(74) *Attorney, Agent, or Firm* — Greer, Burns & Crain, Ltd.

(57) ABSTRACT

In a wafer processing method, the back side of a wafer having a plurality of devices on the front side thereof is ground, thereby reducing the thickness of the wafer to a predetermined thickness. The back side of the wafer is polished after performing the back grinding step, thereby removing a grinding strain, and a silicon nitride film is formed on the back side of the wafer. The thickness of the silicon nitride film to be formed in the silicon nitride film forming step is set to 6 to 100 nm. Thus, the silicon nitride film having a thickness of 6 to 100 nm is formed on the polished back side of the wafer from which a grinding strain has been removed. Accordingly, each device constituting the wafer can ensure a sufficient die strength and a sufficient gettering effect.

3 Claims, 9 Drawing Sheets

FIG. 9

| Film thickness [nm] | Before forced contamination | After forced contamination | |
|---|---|---|---|
| | Mean value | Mean value | Maximum value |
| 200 | ND | ND | ND |
| 100 | ND | ND | ND |
| 50 | ND | ND | ND |
| 10 | ND | ND | ND |
| 7 | ND | ND | ND |
| 6 | ND | ND | ND |
| 5 | ND | 1.62 | 23.24 |
| 3 | ND | 9.71 | 84.81 |
| 1 | ND | 11.05 | 80.05 |
| 0 | ND | 9.73 | 106.24 |

Mean value and maximum value are measured in $1.0 \times 10^{10}$ [atoms/cm$^2$]

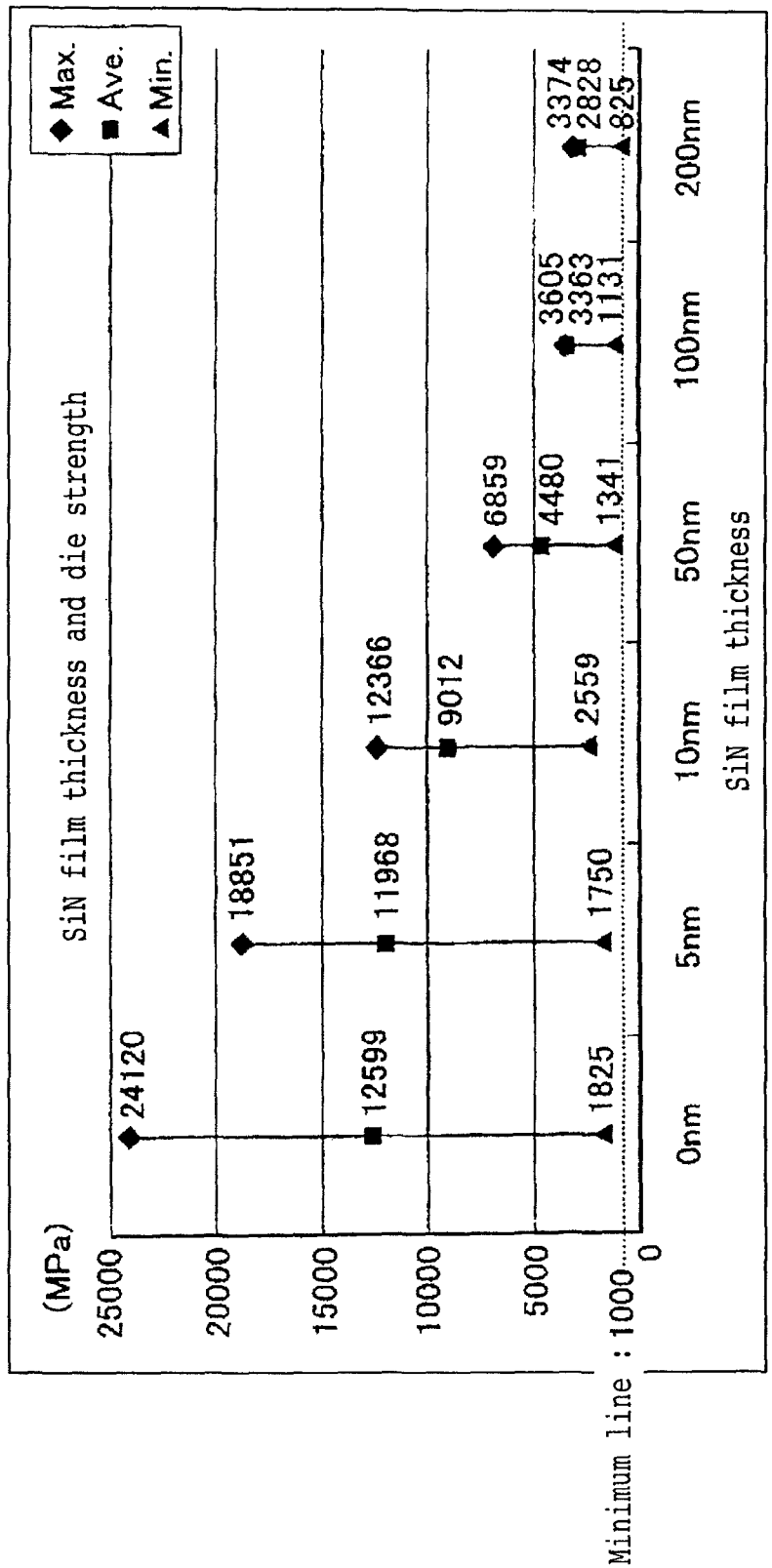

WAFER PROCESSING METHOD

BACKGROUND OF THE INVENTION

1. Field of the Invention

The present invention relates to a wafer processing method which can provide a sufficient die strength and gettering effect on each device constituting a wafer.

2. Description of the Related Art

A plurality of devices such as ICs and LSIs are formed on the front side of a wafer so as to be partitioned by a plurality of crossing division lines. The back side of the wafer is ground to reduce the thickness of the wafer to a predetermined thickness. Thereafter, the wafer is divided into the individual devices by using a dicing apparatus and the devices thus obtained are used for various electronic equipment or the like. Further, a package device also called an MCP (Multi-Chip Package) generally improved in function is also put to practical use (see Japanese Patent Laid-open No. 2009-26992, for example). This package device is fabricated by grinding the back sides of plural wafers to reduce the thickness of each wafer to 100 μm or less and next stacking these wafers so as to connect terminals (electrodes) formed on the upper and lower devices of the stacked wafers.

Regardless of whether or not the wafers are stacked, each device is formed on the front side of a silicon substrate and the back side of the silicon substrate is ground to reduce the thickness of the wafer to a predetermined thickness. Thereafter, the silicon substrate is cut by dicing to obtain the individual devices. However, when the back side of the wafer is ground, a grinding strain is left on the back side of the wafer to cause a reduction in die strength of each device. To cope with this problem, there has been proposed a technique such that the back side of the wafer subjected to back grinding is polished by using a polishing pad to remove the grinding strain, thereby improving the die strength of each device (see Japanese Patent Laid-open No. 2006-80329, for example).

SUMMARY OF THE INVENTION

However, the grinding strain has a gettering effect such that it attracts heavy metal atoms such as copper atoms to the back side of the wafer to prevent the movement of the heavy metal atoms toward the front side of the wafer (where the devices are formed), thereby suppressing a reduction in function of each device. Accordingly, when the back side of the wafer is polished to remove the grinding strain, the gettering effect of the grinding strain is lost to cause a reduction in function of each device.

It is therefore an object of the present invention to provide a wafer processing method which can ensure a sufficient die strength of each device constituting a wafer and can also produce a sufficient gettering effect.

In accordance with an aspect of the present invention, there is provided a wafer processing method for processing the back side of a wafer composed of a silicon substrate and a plurality of devices formed on the front side of the silicon substrate so as to partitioned by a plurality of division lines, the wafer processing method including a back grinding step of grinding the back side of the wafer having the devices on the front side thereof, thereby reducing the thickness of the wafer to a predetermined thickness; a back polishing step of polishing the back side of the wafer after performing the back grinding step, thereby removing a grinding strain; and a silicon nitride film forming step of forming a silicon nitride film on the back side of the wafer after performing the back polishing step; wherein the thickness of the silicon nitride film to be formed in the silicon nitride film forming step is set to 6 to 100 nm.

According to the present invention, the silicon nitride film having a thickness of 6 to 100 nm is formed on the polished back side of the wafer from which a grinding strain has been removed. Accordingly, each device constituting the wafer can ensure a sufficient die strength and a sufficient gettering effect. Further, it is confirmed from a test that when the thickness of the silicon nitride film is 200 nm or more, the die strength of each device becomes less than 1000 MPa as an acceptable limit and that when the thickness of the silicon nitride film is less than 6 nm, a sufficient gettering effect cannot be exhibited. Accordingly, by setting the thickness of the silicon nitride film on the back side of each device to 6 to 100 nm, each device can ensure a sufficient die strength greater than an acceptable limit and can also ensure a sufficient gettering effect.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 9 is a table showing the result of a gettering effect test;

FIG. 13 is a graph showing the result of the die strength test.

DETAILED DESCRIPTION OF THE PREFERRED EMBODIMENTS

Figure 1:
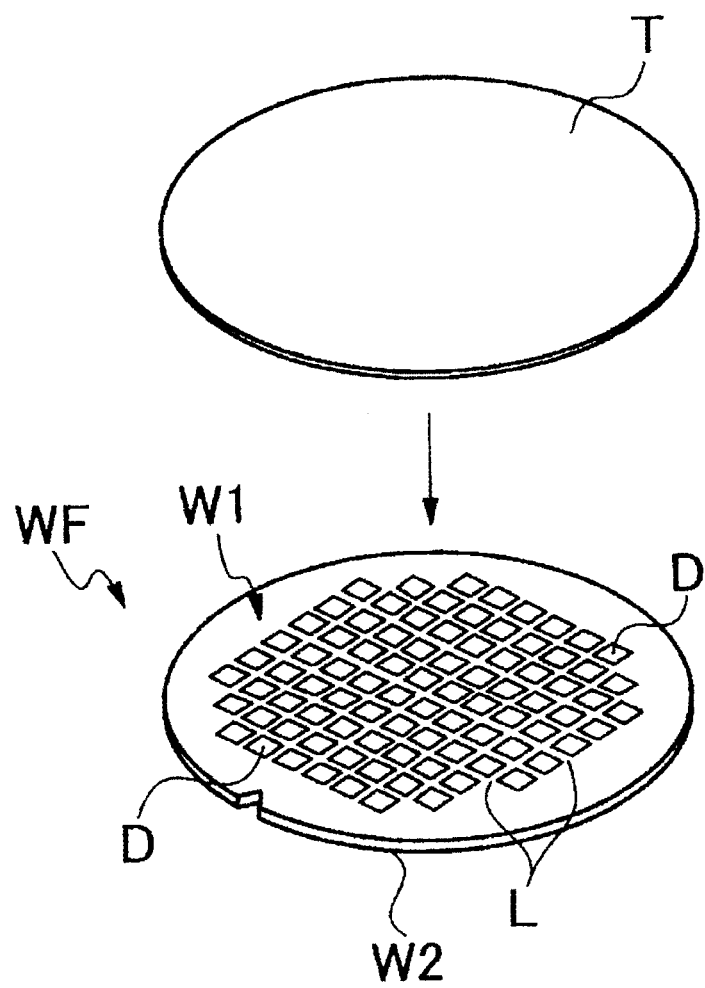
FIG. 1 is an exploded perspective view of a wafer and a protective tape attached thereto.

Referring to FIG. 1, there is shown a wafer WF. The wafer WF is composed of a silicon substrate and a plurality of devices D formed on the front side of the silicon substrate, i.e., on the front side W1 of the wafer WF. These devices D formed on the front side W1 of the wafer WF are partitioned by a plurality of crossing division lines L. The wafer WF is to be cut along the division lines L to obtain the individual devices D respectively corresponding to chips. As shown in FIG. 1, a protective tape T for protecting the devices D is attached to the front side W1 of the wafer WF. There will now be described a method for ensuring a sufficient die strength and a sufficient gettering effect in each device D by forming a silicon nitride film on the back side W2 of the wafer WF after grinding and polishing the back side W2.

1. Back Grinding Step

Figure 2:
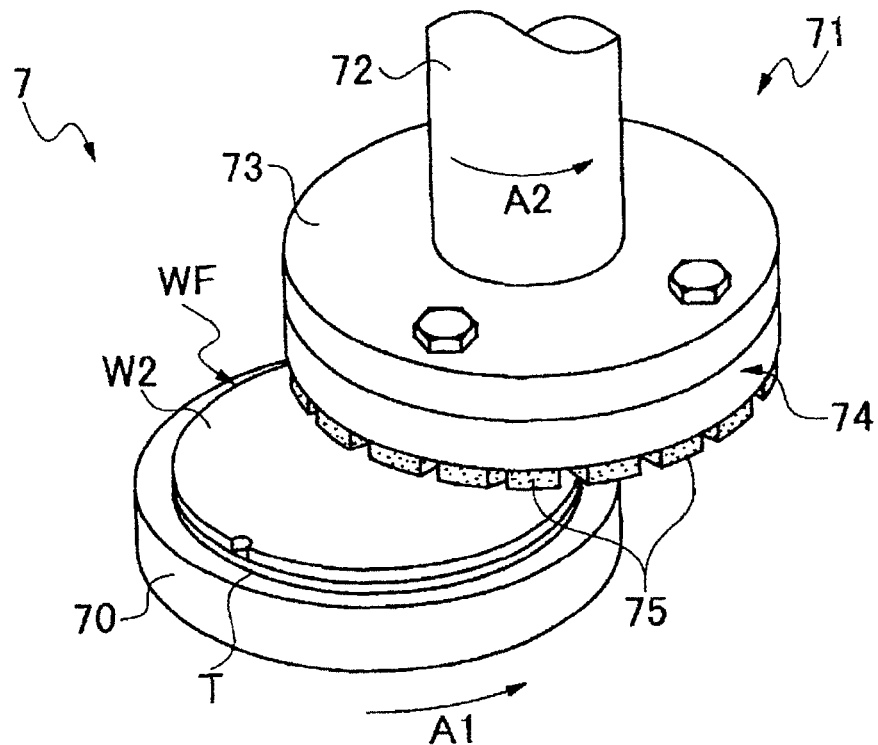
FIG. 2 is a perspective view showing a back grinding step.

As shown in FIG. 2, the wafer WF with the protective tape T is held on a chuck table 70 of a grinding apparatus 7 in the condition where the protective tape T comes into contact with the upper surface of the chuck table 70 and the back side W2 of the wafer WF is therefore exposed. The chuck table 70 thus holding the wafer WF is located below grinding means 71. The grinding means 71 includes a spindle 72, a mount 73 formed at the lower end of the spindle 72, a grinding wheel 74 mounted on the lower surface of the mount 73, and a plurality of annularly arranged abrasive members 75 fixed to the lower surface of the grinding wheel 74.

Figure 3:
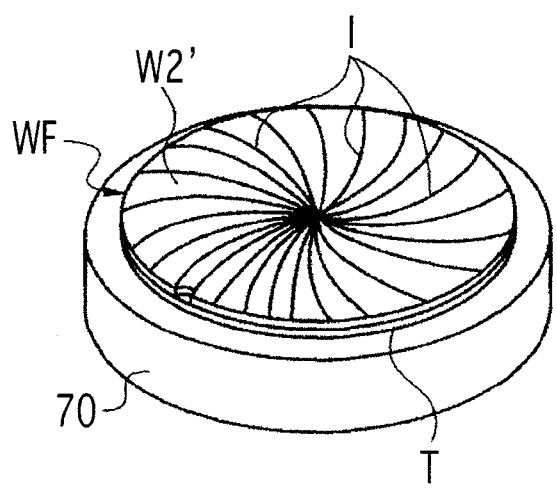
FIG. 3 is a perspective view of the wafer processed by the back grinding step, showing saw marks formed on the back side of the wafer.

In operation, the back side W2 of the wafer WF is opposed to the abrasive members 75. In this condition, the chuck table 70 is rotated at 300 rpm, for example, in the direction shown by an arrow A1 in FIG. 2, and the spindle 72 is also rotated at 6000 rpm, for example, in the direction shown by an arrow A2 in FIG. 2. In this condition, the grinding means 71 is lowered to bring the rotating abrasive members 75 into contact with the back side W2 of the wafer WF, thereby grinding the back side W2. During the grinding operation, the abrasive members 75 are rotated so as to always pass through the center of rotation of the wafer WF. When the thickness of the wafer WF is reduced to a predetermined thickness by this grinding operation, the grinding means 71 is raised to end the grinding operation. As the result of this grinding of the back side W2, a plurality of saw marks I are formed on the ground back side W2' of the wafer WF so as to radially extend from the center of rotation of the wafer WF along the locus of rotation of the abrasive members 75 as shown in FIG. 3.

2. Back Polishing Step

Figure 4:
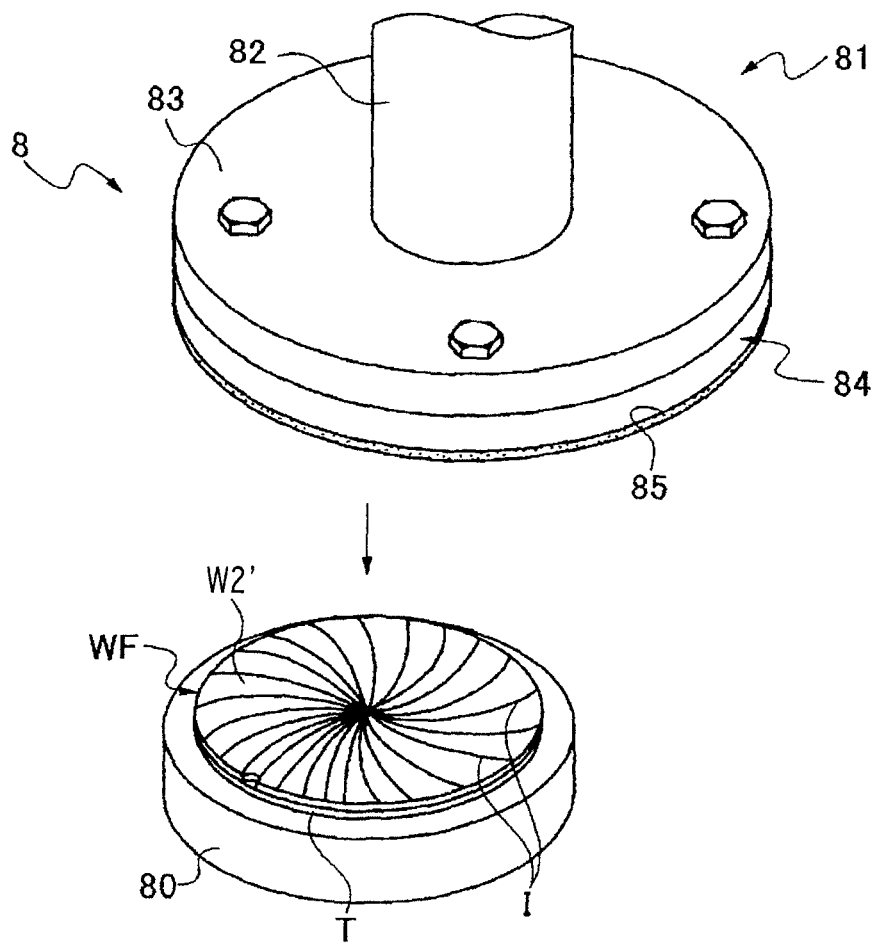
FIG. 4 is a perspective view showing a condition where the wafer shown in FIG. 3 is held on a chuck table of a polishing apparatus.

After performing the back grinding step, the wafer WF with the protective tape T is held on a chuck table 80 of a polishing apparatus 8 in the condition where the protective tape T comes into contact with the upper surface of the chuck table 80 and the ground back side W2' of the wafer WF is therefore exposed as shown in FIG. 4. The chuck table 80 thus holding the wafer WF is located below polishing means 81. The polishing means 81 includes a spindle 82, a mount 83 formed at the lower end of the spindle 82, a wheel 84 mounted on the lower surface of the mount 83, and a polishing pad 85 fixed to the lower surface of the wheel 84. For example, the polishing pad 85 is composed of a base member of nonwoven fabric, polyurethane, etc. and abrasive grains dispersed and bonded in the base member.

Figure 5:
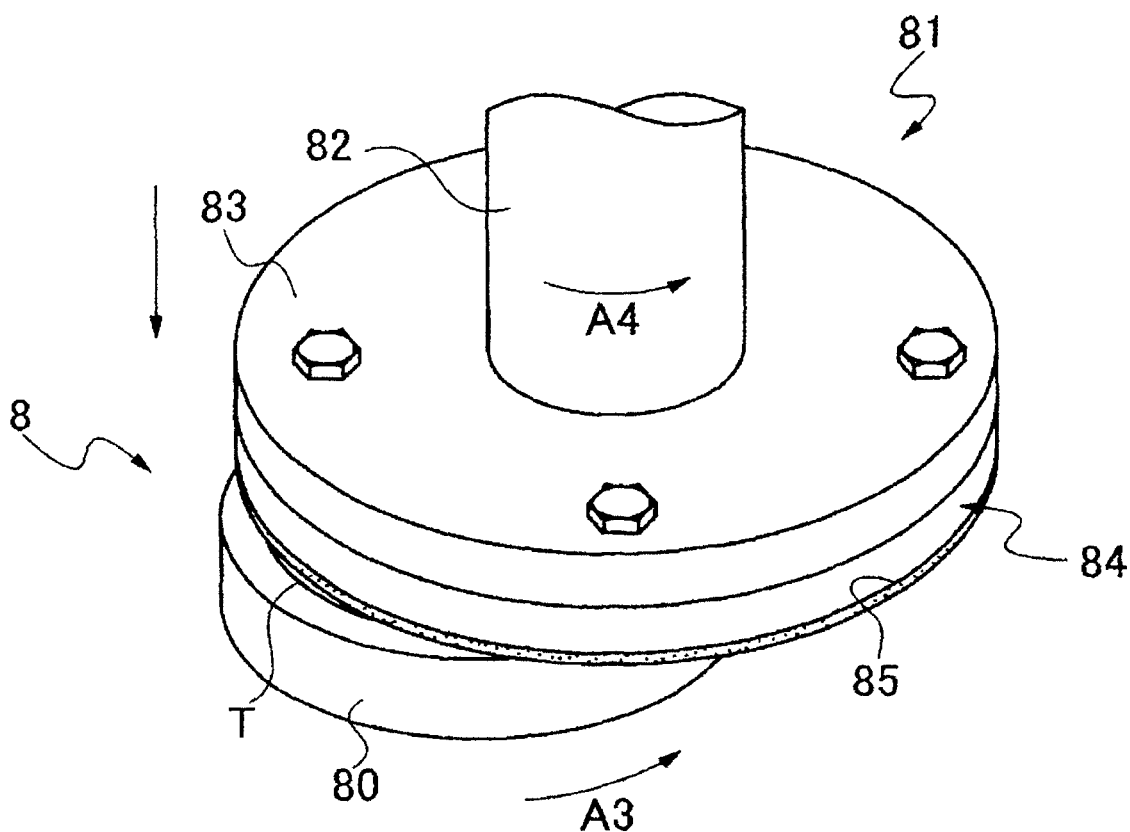
FIG. 5 is a perspective view showing a back polishing step.
Figure 6:
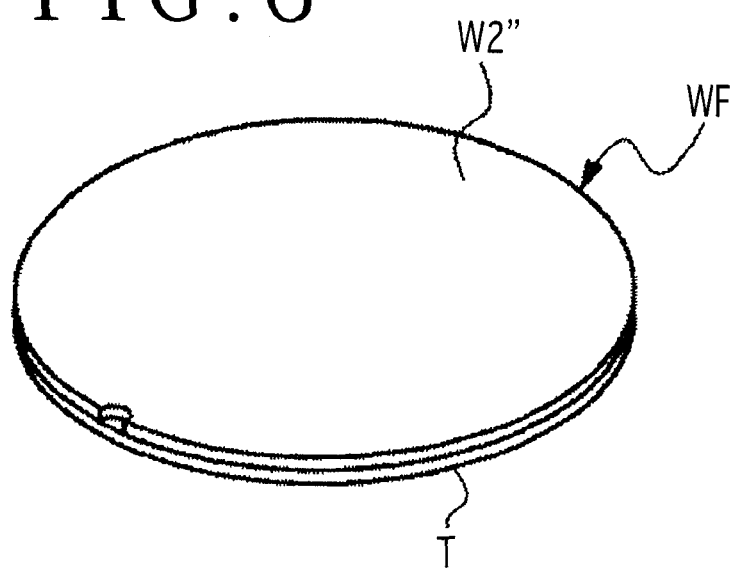
FIG. 6 is a perspective view of the wafer processed by the back polishing step, showing a condition that the saw marks have been removed.

In operation, the ground back side W2' of the wafer WF is opposed to the polishing pad 85. In this condition, the chuck table 80 is rotated at 100 rpm, for example, in the direction shown by an arrow A3 in FIG. 5, and the spindle 82 is also rotated at 3000 rpm, for example, in the direction shown by an arrow A4 in FIG. 5. In this condition, the polishing pad 85 is brought into contact with the back side W2' of the wafer WF to polish the back side W2'. During the polishing operation, the polishing pad 85 is always kept in contact with the whole surface of the back side W2'. When the saw marks I formed on the back side W2' are removed by this polishing operation to thereby form a planarized back side W2" from which a grinding strain has been removed, the polishing operation is ended. Thus, the grinding strain in the wafer WF is removed to thereby improve the die strength of each device D.

3. Silicon Nitride Film Forming Step

Figure 7:
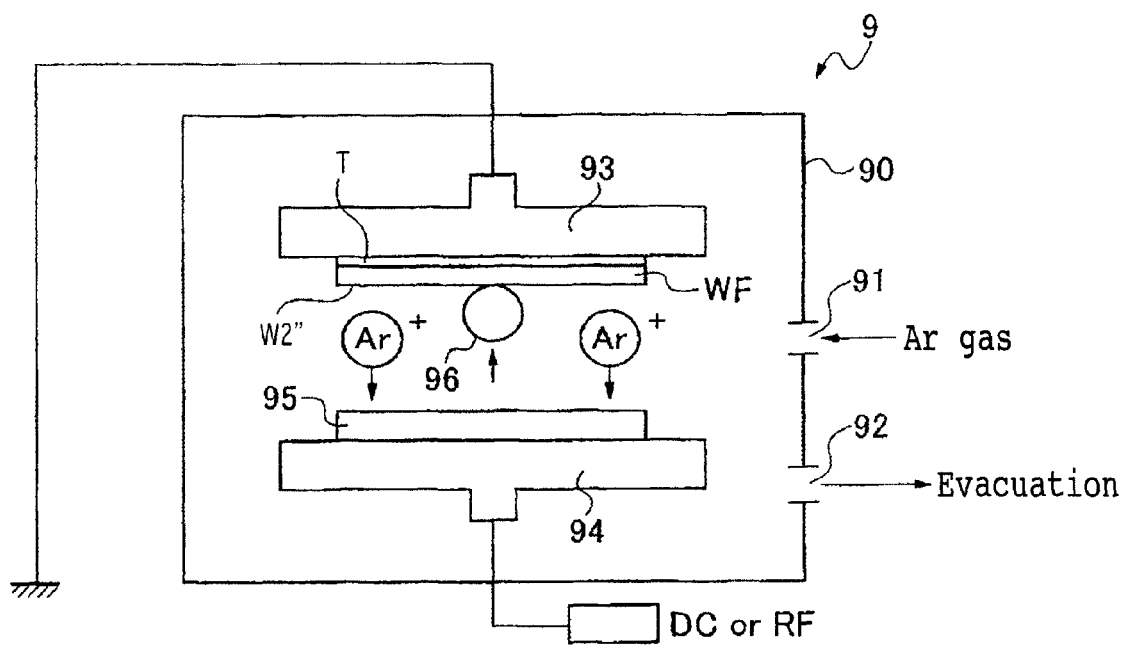
FIG. 7 is a schematic diagram showing the configuration of a sputtering apparatus for performing a silicon nitride film forming step.

After performing the back polishing step, a silicon nitride film is formed on the polished back side W2" of the wafer WF. The silicon nitride film may be formed by sputtering, for example. A sputtering apparatus 9 shown in FIG. 7 may be used for the formation of the silicon nitride film by sputtering. The sputtering apparatus 9 includes a chamber 90 having a gas inlet 91 and a gas outlet 92. An anode 93 and a cathode 94 are accommodated in the chamber 90 so as to be opposed to each other. The wafer WF is held through the protective tape T to the anode 93 in the condition where the polished back side W2" of the wafer WF is exposed. On the other hand, a target 95 of SiNx as the material of the silicon nitride film is held to the cathode 94. A magnetron cathode having a diameter of 4 inches, for example, may be used as the cathode 94.

Figure 8:
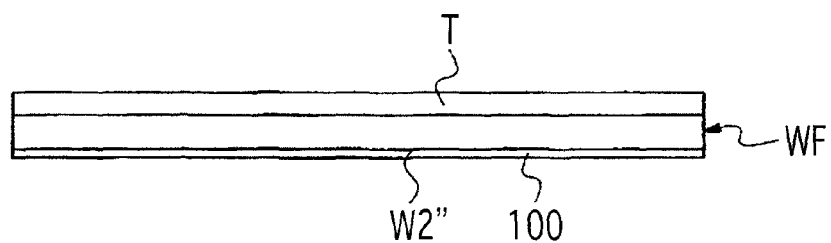
FIG. 8 is an elevational view of the wafer processed by the silicon nitride film forming step, showing a silicon nitride film formed on the back side of the wafer.

In operating the sputtering apparatus 9, the chamber 90 is evacuated by removing inside gases from the gas outlet 92, and Ar gas and $N_2$ gas are next introduced from the gas inlet 91 into the chamber 90. For example, the Ar gas is introduced at a rate of 10 ml/min and the $N_2$ gas is introduced at a rate of 50 ml/min. The gas pressure in the chamber 90 is set to 0.3 Pa, for example. An RF voltage of 700 W, for example, is applied between the anode 93 and the cathode 94 to thereby generate a glow discharge. As a result, argon ions Ar+ in the plasma collide with the target 95 on the cathode 94 to eject target atoms 96 from the surface of the target 95. The ejected target atoms 96 are attracted toward the anode 93, so that a silicon nitride film 100 is formed on the back side W2" of the wafer WF as shown in FIG. 8. By forming the silicon nitride film 100 on the back side W2" of the wafer WF as shown in FIG. 8, the die strength of each device D constituting the wafer WF can be ensured and a gettering effect can also be produced.

Example 1

Figure 10:
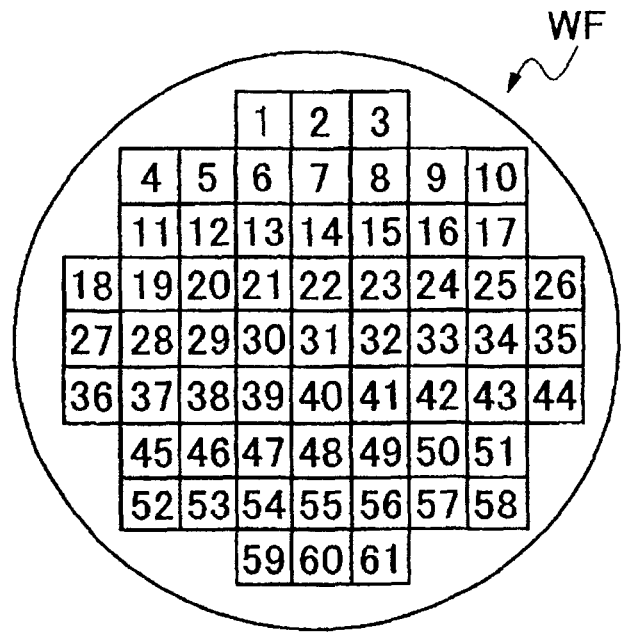
FIG. 10 is a plan view showing the configuration of the wafer subjected to a die strength test.

A test was conducted to obtain the thickness of the silicon nitride film for suitably ensuring the die strength and the gettering effect of each device D. More specifically, the back grinding step, the back polishing step, and the silicon nitride film forming step mentioned above were performed to obtain various samples of the wafer WF in which silicon nitride films having different thicknesses were formed on the back sides of the samples. These samples were used to conduct a gettering effect test and a die strength test, thereby examining the relation between the thickness of the silicon nitride film and the die strength and gettering effect of each device. In conducting the above tests, the conditions of the wafer WF were set as follows:

Wafer: silicon wafer
Wafer diameter: 8 inches
Wafer thickness: 500 μm (after polishing the back side of the wafer)
Chip size: 20 mm×20 mm
Number of chips per wafer: 61 (see FIG. 10)

(1) Gettering Effect Test
(A) Silicon Nitride Film Forming Step

A plurality of wafers subjected to the back grinding step and the back polishing step were prepared and the silicon nitride film forming step was performed to form silicon nitride films having different thicknesses of 1, 3, 5, 6, 7, 10, 50, 100, and 200 nm on the back sides of these wafers. Further, a wafer without a silicon nitride film was also prepared, in which no silicon nitride film was formed on the back side of the wafer subjected to the back grinding step and the back polishing step. All of these wafers were subjected to the following steps (B) to (D).

(B) Forced Contamination Step

A Cu standard solution (copper sulfate) was applied in an amount of $1.0 \times 10^{13}$ atoms/cm² to the back sides of all the wafers each having a diameter of 8 inches, in which the silicon nitride films having the above-mentioned different thicknesses (inclusive of zero thickness) were formed on the back sides of the wafers. Thus, forced contamination of the wafers with copper was made.

(C) Heating Step

After drying the coating of the Cu standard solution on the back sides of all the wafers, they were heated at 350° C. for three hours to obtain a condition where the copper atoms in each wafer were easily diffused.

(D) Measuring Step

After cooling all the wafers, the amount of copper atoms on the other side (front side) of each wafer opposite to the back side coated with the Cu standard solution was measured by using TXRF (total reflection X-ray fluorescence analyzing apparatus manufactured by Technos Co., Ltd.) More specifically, the front side of each wafer was partitioned into a plurality regions each having a size of 15 mm×15 mm, and the amount of copper atoms in each region was measured to obtain the mean value and the maximum value of the amounts of copper atoms in all of the regions. Further, also before performing the forced contamination step, the amount of copper atoms on the front side of each wafer was measured by a similar method.

In the case that copper atoms were detected on the front side of each wafer in this step, it can be determined that copper atoms were diffused in each wafer and that the gettering effect was zero or insufficient. Conversely, in the case that copper atoms were not detected on the front side of each wafer, it can be determined that copper atoms were trapped on the silicon nitride film and that the gettering effect was sufficient. The test result is shown in FIG. 9. The threshold (detection limit) for determination whether or not copper atoms were detected was set to $0.5 \times 10^{10}$ atoms/cm².

As apparent from the test result shown in FIG. 9, in the case that the forced contamination step was performed and that the thickness of the silicon nitride film was 5 nm or less, copper atoms were detected on the front side of each wafer both at the mean value and at the maximum value, so that it was confirmed that the gettering effect was zero or insufficient. In contrast, in the case that the forced contamination step was performed and that the thickness of the silicon nitride film was 6 nm or more, copper atoms were not detected on the front side of each wafer both at the mean value and at the maximum value, so that it was confirmed that the gettering effect was sufficient (ND in FIG. 9 indicates that copper atoms were not detected). Accordingly, it is considered that the thickness of the silicon nitride film must be set to 6 nm or more to ensure a sufficient gettering effect. Further, it is also apparent from FIG. 9 that the larger the thickness of the silicon nitride film, the better the gettering effect.

(2) Die Strength Test

As shown in FIG. 10, the wafer WF is composed of 61 chips numbered by #1 to #61. After performing the silicon nitride film forming step, each chip of the wafer WF was subjected to the measurement of a die strength. In the silicon nitride film forming step, a plurality of silicon nitride films having different thicknesses of 0, 5, 10, 50, 100, and 200 nm were formed. The measurement of a die strength was made by the following specific method.

(E) Dividing Step

Each wafer was cut along the division lines by using a cutting apparatus to obtain the individual chips #1 to #61 shown in FIG. 10.

(F) Die Strength Measuring Step

The die strength of each chip was measured by using a compression tester (AGI–1kN9) manufactured by Shimadzu Corp. A specific measuring method for the die strength is as follows:

(F-1)

Figure 11:
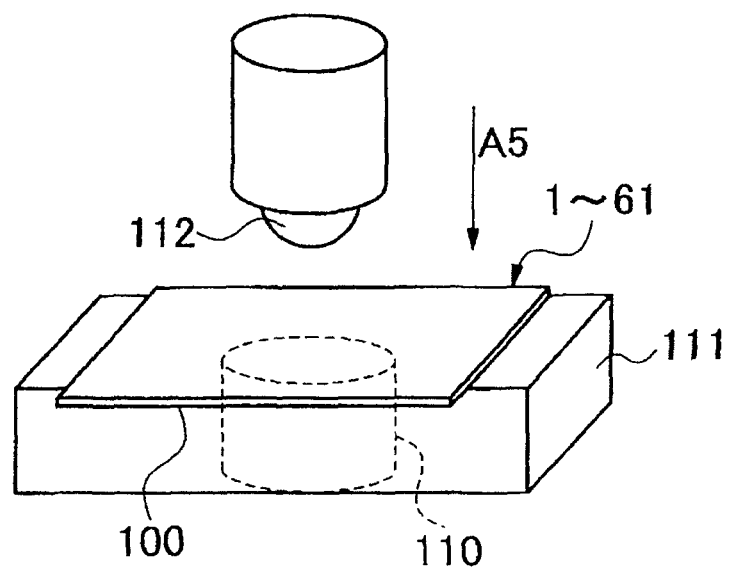
FIG. 11 is a perspective view showing the die strength test.
Figure 12:
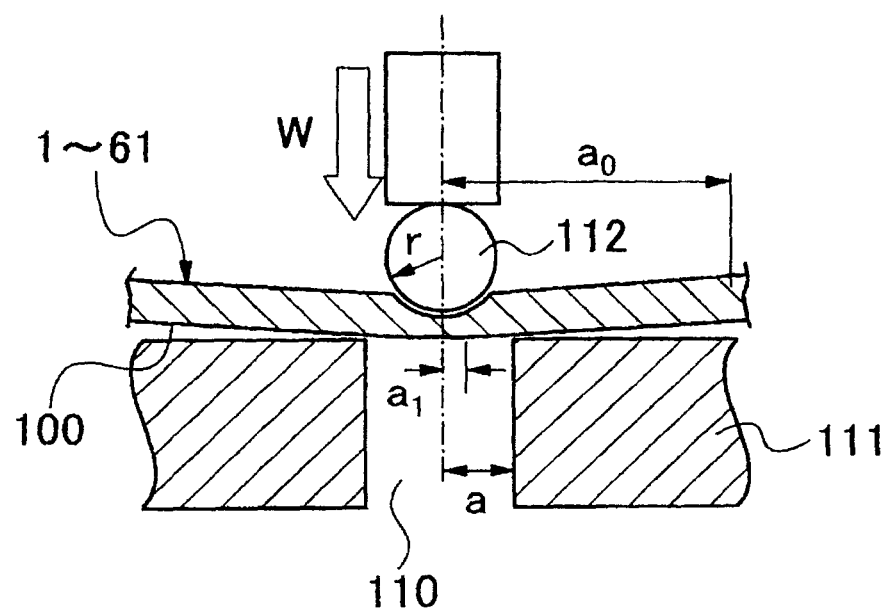
FIG. 12 is a sectional view showing the die strength test.

As shown in FIGS. 11 and 12, each of the chips #1 to #61 is placed on a base 111 having a central circular hole 110 in the condition where the silicon nitride film formed on the back side of each chip is oriented downward.

(F-2)

A pressure is applied to each of the chips #1 to #61 downward (in the direction shown by an arrow A5 in FIG. 11) by using a pressure ball 112 having a spherical surface.

(F-3)

At the moment of fracture of each of the chips #1 to #61, a die strength δ is calculated by using Eq. (1) shown below.

$$\delta = \frac{3W9.8}{4\pi h^2}\left[(1+v)\left\{\frac{8}{3} + 2\text{Ln}\frac{a}{a_1} - 2\text{Ln}2\right\} + (1-v)\frac{a^2}{a_0^2}\left\{1 - \frac{2}{5}\frac{a_1^2}{a^2}\right\}\right] \quad \text{Eq. (1)}$$

The definition and value of each variable in Eq. (1) are as follows (see FIG. 12):
 δ: Die strength
 W: Fracture strength (measured value) kgf
 h: Chip thickness=500 µm
 v: Poisson's ratio (silicon)=0.28
 a: Hole radius=3.5 mm
 $a_0$: Chip radius=10 mm
 $a_1$ is the radius of contact between the pressure ball 112 and each chip, and it is calculated by using Eq. (2) shown below.

$$a_1 = \left\{\frac{3}{4}r\left(\frac{1-v^2}{\varepsilon_1} + \frac{1-v_2^2}{\varepsilon_2}\right)W\right\}^{\frac{1}{3}} \quad \text{Eq. (2)}$$

The definition and value of each variable in Eq. (2) are as follows:
 $\varepsilon_1$: Young's modulus (silicon)=$1.31 \times 10^5$ MPa
 $\varepsilon_2$: Young's modulus (pressure ball)=$2.01 \times 10^4$ MPa
 r: Pressure ball radius=3.0 mm
 $v_2$: Poisson's ratio (pressure ball)=0.3

The die strength of each chip was measured by using Eq. (1) above to obtain a maximum value, mean value, and minimum value. This measurement was made for the different thicknesses of the silicon nitride films. As shown in FIG. 13, the minimum line of the die strength (the minimum acceptable limit of the die strength) is set to 1000 MPa and the film thickness providing a minimum value higher than 1000 MPa for the die strength is 0 to 100 nm. In contrast, when the film thickness is 200 nm, the minimum value for the die strength is lower than 1000 MPa.

(3) Optimum Film Thickness

As described above, the thickness of the silicon nitride film must be set to 6 nm or more to ensure a sufficient gettering effect as apparent from the result of the gettering effect test shown in FIG. 9. Further, in order to ensure a sufficient die strength greater than an acceptable limit, the thickness of the silicon nitride film must be set to 0 to 100 nm. Accordingly, in order to ensure both a sufficient gettering effect and a sufficient die strength, the film thickness of the silicon nitride film to be formed on the back side of a silicon wafer must be set to 6 to 100 nm.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a back side of a wafer composed of a silicon substrate and a plurality of devices formed on a front side of said silicon substrate so as to be partitioned by a plurality of division lines, said wafer processing method comprising:
   a back grinding step of grinding the back side of said wafer having said devices on the front side thereof, thereby reducing the thickness of said wafer to a predetermined thickness;
   a back polishing step of polishing the back side of said wafer after performing said back grinding step, thereby removing a grinding strain; and
   a silicon nitride film forming step of forming a silicon nitride film on the back side of said wafer after performing said back polishing step, but prior to a step of partitioning along the division lines,
   wherein the thickness of said silicon nitride film to be formed in said silicon nitride film forming step is set to 6 to 100 nm.

2. The wafer processing method according to claim 1, wherein the thickness of said silicon nitride film is chosen such that a sufficient gettering effect is realized while also resulting in said wafer having a die strength of at least 1000 MPa.

3. The wafer processing method according to claim 1, wherein said silicon nitride film is formed only on the back side of said wafer.

* * * * *